United States Patent
Wakimoto

(10) Patent No.: US 6,753,540 B2
(45) Date of Patent: Jun. 22, 2004

(54) LITHOGRAPHIC METHOD USING VARIABLE-AREA ELECTRON-BEAM LITHOGRAPHY MACHINE

(75) Inventor: Osamu Wakimoto, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 10/281,381

(22) Filed: Oct. 25, 2002

(65) Prior Publication Data

US 2003/0107008 A1 Jun. 12, 2003

(51) Int. Cl.[7] ............................................. H01J 37/302
(52) U.S. Cl. ............................................. 250/492.23
(58) Field of Search ........................ 250/492.1, 492.2, 250/492.22, 492.23, 492.3

(56) References Cited

U.S. PATENT DOCUMENTS

| | | | | |
|---|---|---|---|---|
| 4,532,598 A | * | 7/1985 | Shibayama et al. ............ | 716/21 |
| 4,683,366 A | * | 7/1987 | Harte et al. ............ | 219/121.25 |
| 4,694,178 A | * | 9/1987 | Harte ...................... | 250/396 R |
| 4,914,304 A | * | 4/1990 | Koyama ................... | 250/492.2 |
| 5,047,646 A | | 9/1991 | Hattori et al. ........... | 250/396 R |
| 5,254,417 A | | 10/1993 | Wada ............................ | 430/5 |
| 6,455,863 B1 | * | 9/2002 | Babin et al. ............ | 250/492.23 |

* cited by examiner

*Primary Examiner*—John R. Lee
*Assistant Examiner*—Christopher M. Kalivoda
(74) *Attorney, Agent, or Firm*—Webb Ziesenheim Logsdon Orkin & Hanson, P.C.

(57) ABSTRACT

A lithographic method by the use of a variable-area electron-beam lithography machine makes use of an electron beam having a cross section shaped into right-angled isosceles triangles. The lithography machine can shape the cross section into the right-angled isosceles triangles or a rectangle. Where a trapezoidal figure to be written has at least one leg (oblique side) making an angle of 45 degrees with the normal to the bottom base, a portion including the 45-degree leg is extracted and written by the right-angled isosceles triangles.

6 Claims, 10 Drawing Sheets

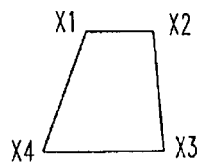
FIG.13P1
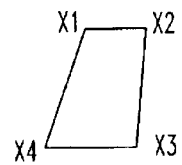
FIG.13P2
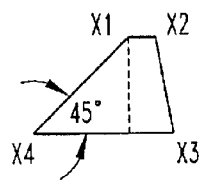
FIG.13P3
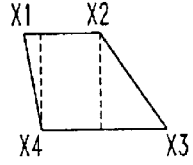
FIG.13P4
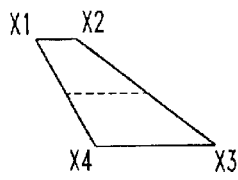
FIG.13P5
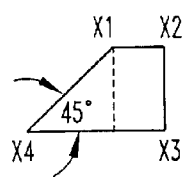
FIG.13P7
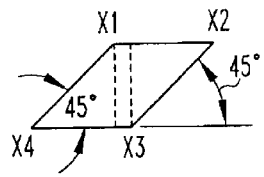
FIG.13P8
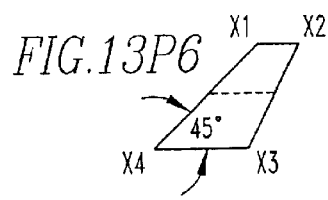
FIG.13P6
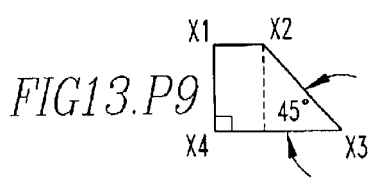
FIG13.P9
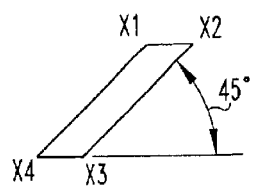
FIG.13P10
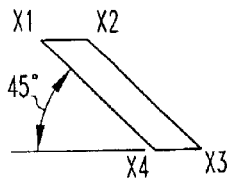
FIG.13P11

LITHOGRAPHIC METHOD USING VARIABLE-AREA ELECTRON-BEAM LITHOGRAPHY MACHINE

BACKGROUND OF THE INVENTION

1. Field of the Invention

The present invention relates to an electron-beam lithographic method and, more particularly, to an electron-beam lithographic method for writing a desired pattern on a material by passing an electron beam through the aperture in a first slit (apertured baffle plate) and then directing the beam at a desired position on a second slit (apertured baffle plate) to shape the cross section of the beam into a desired shape, deflecting this deflected beam, and directing the beam at a desired location on the material.

2. Description of Related Art

In a variable-area electron-beam lithography machine, an IC (integrated circuit) pattern is formed on a material to be written, such as a mask plate, by combining various graphical figures, such as rectangular, square, triangular, and trapezoidal forms. In a lithography machine using an electron beam having a rectangular cross section with four right-angled corners, every pattern having oblique lines, such as a triangular pattern, is approximately resolved into rectangles and then lithography is carried out. This method is simple but has the disadvantage that the writing speed is slow.

In recent years, a novel electron-beam lithography machine making use of an electron beam having a non-rectangular cross section has been developed in order to perform lithography at a higher speed. In particular, with respect to a pattern having forms often encountered in LSI (large scale integration) circuits, such as a pattern having 45-degree oblique lines, various apertured baffle plates are prepared which are capable of shaping the cross section of the beam into such forms. That is, the cross section of the beam is shaped into a form different from a rectangle with four right-angled corners.

Where a pattern is created using an electron beam of a cross section having four right-angled isosceles triangles oriented in different directions and a rectangle with four right-angled corners, if the written pattern consists only of 45-degree oblique lines, then it is simple to determine how these portions of the cross section of the beam are used. However, in LSI circuit design, it is advantageous to be able to use data about any arbitrary angle. Therefore, it is unrealistic that the oblique lines of a pattern to be written are only 45-degree oblique lines.

In order to make effective use of the aforementioned electron beam having a cross section of right-angled isosceles triangles to provide improved writing speed, it is necessary to extract data about the right-angled isosceles triangles found in a pattern from data about the pattern to be written.

A high efficiency is not obtained where the conventional division algorithm is employed which uses a beam having a rectangular cross section. For example, where a pattern having a shape as indicated by FIG. 1A is written, if the width of the pattern is smaller than the lateral dimension of the rectangular cross section of an electron beam, the whole pattern is divided into portions as indicated by FIG. 1B. Then, the portions including oblique lines are split into stripes and written as indicated by FIG. 1C.

On the other hand, where the width of the pattern is greater than the lateral dimension of the rectangular cross section of the beam as indicated by FIG. 1A', the pattern is vertically divided into parts from the oblique lines as indicated by FIG. 1D. The oblique-side portions of the split portions are separated as triangular portions. These separated triangular portions are split into stripes and written as indicated by FIG. 1E.

In the case of FIG. 1D, since the triangular portions are separated, if the angle of the oblique-side portions is 45 degrees, then it is easy to use the electron beam having a cross section of right-angled isosceles triangles. However, in the case of FIG. 1B, even if the angle of the oblique-side portions is 45 degrees, there is no chance of using the electron beam having a cross section of right-angled isosceles triangles, because the triangular portions cannot be separated.

SUMMARY OF THE INVENTION

It is an object of the present invention to provide a lithographic method which provides an improved writing speed by the use of a variable-area electron-beam lithography machine by making effective use of an electron beam having a cross section shaped into right-angled isosceles triangles.

A lithographic method according to the present invention uses a variable-area electron-beam lithography machine having first and second apertured baffle plates, each of the apertured baffle plates having an aperture. The lithographic method comprises the steps of: passing an electron beam through the first baffle plate having the aperture with four right-angled corners; directing the beam emerging from the aperture in the first baffle plate at the second baffle plate; and directing the beam emerging from the aperture in the second baffle plate at a material to be written. The electron-beam lithography machine is capable of shaping the cross section of the beam emerging from the aperture in the second baffle plate into a rectangle or right-angled isosceles triangles. Where a trapezoidal graphical figure having at least one leg (oblique side) making an angle of 45 degrees with respect to the normal to the bottom base is to be written on the material, a division algorithm for extracting (isolating) a portion including the 45-degree leg is used. The extracted portion including the leg is written by the right-angled isosceles triangles defined by the cross section of the beam.

Another lithographic method according to the present invention uses a variable-area electron-beam lithography machine as described. When a trapezoidal graphical figure is to be written on the material, a sequence of operations is performed. This sequence of operations consists of performing a first step consisting of making a decision as to whether the angle made between one leg (oblique side) of the trapezoidal figure and the normal to the bottom base is 45 degrees and whether the angle made between the other leg and the normal to the bottom base is 45 or 0 degrees, performing a second step consisting of making a decision as to whether it is necessary to divide the trapezoidal graphical figure in height direction (that is, in the direction perpendicular to the base) if the result of the decision made in the first step is YES, performing a third step consisting of dividing the trapezoidal graphical figure in the height direction using a unit division length equal to the length of the bottom base of the trapezoidal graphical figure, separating portions including the legs from the resulting graphical figure parts, and writing the separated portions by the right-angled isosceles triangles of the cross section of the beam if the result of the decision made in the second step is YES, performing a fourth step consisting of separating the portions including the legs of the trapezoidal graphical figure and writing the separated portions by the right-angled isosceles triangles of the cross section of the beam if the result of the decision made in the second step is NO, performing a fifth step consisting of making a decision as to whether it is necessary to separate the portions including the legs if the result of the decision made in the first step is NO, and performing a sixth step consisting of separating the portions of the legs if the result of the decision made in the fifth step is YES and writing the portions including the legs by the right-angled isosceles triangles of the cross section of the beam if the angle made between the leg of each separated portion and the bottom base is 45 degrees.

In a further lithographic method according to the present invention uses a variable-area electron-beam lithography machine having, as described, a trapezoidal graphical figure to be written on the material, a sequence of operations is performed. This sequence of operations consists of performing a first step consisting of making a decision as to whether the angle made between one leg of the trapezoidal graphical figure and the normal to the bottom base is 45 degrees and whether the angle made between the other leg and the normal to the bottom base is 45 degrees, performing a second step consisting of making a decision as to whether it is necessary to divide the trapezoidal graphical figure in height direction (that is, in the direction perpendicular to the base) if the result of the decision made in the first step is YES, performing a third step consisting of dividing the trapezoidal graphical figure in the height direction using a unit division length equal to the length of the bottom base of the trapezoidal graphical figure, separating portions including the legs from the resulting graphical figure parts, and writing the separated portions by the right-angled isosceles triangles of the cross section of the beam if the result of the decision made in the second step is YES, performing a fourth step consisting of separating the portions including the legs of the trapezoidal graphical figure and writing the separated portions by the right-angled isosceles triangles of the cross section of the beam if the result of the decision made in the second step is NO, performing a fifth step consisting of making a decision as to whether it is necessary to separate the portions including the legs if the result of the decision made in the first step is NO, and performing a sixth step consisting of separating the portions including the legs if the result of the decision made in the fifth step is YES and writing the portions including the legs by the right-angled isosceles triangles of the cross section of the beam if the angle made between the leg of each separated portion and the bottom base is 45 degrees.

Still another lithographic method according to the present invention uses a variable-area electron-beam lithography machine as described where a trapezoidal graphical figure is to be written on the material, a sequence of operations is performed. This sequence of operations consists of performing a first step consisting of making a decision as to whether the angle made between any one leg of the trapezoidal graphical figure and the normal to the bottom base is 45 degrees, performing a second step consisting of making a decision as to whether it is necessary to divide the trapezoidal graphical figure if the result of the decision made in the first step is YES, performing a third step consisting of dividing the trapezoidal graphical figure in height direction (that is, in the direction perpendicular to the base) using a unit division length equal to the length of the bottom base of the trapezoidal graphical figure, separating portions including the legs from the resulting graphical figure parts, and writing the separated portions by the right-angled isosceles triangles of the cross section of the beam if the result of the decision made in the second step is YES, performing a fourth step consisting of separating the portions including the legs of the trapezoidal graphical figure and writing the separated portions by the right-angled isosceles triangles of the cross section of the beam if the result of the decision made in the second step is NO, performing a fifth step consisting of making a decision as to whether it is necessary to separate portions including the legs if the result of the decision made in the first step is NO, and performing a sixth step consisting of separating the portions including the legs if the result of the decision made in the fifth step is YES and writing the portions including the legs by the right-angled isosceles triangles of the cross section of the beam if the angle made between the leg of each separated portion and the bottom base is 45 degrees.

Yet another lithographic method according to the present invention uses a variable-area electron-beam lithography machine as described where a written graphical figure is a parallelogram including a top base, a bottom base, and two legs, if each of the legs makes an angle of 45 degrees with respect to the normal to the bottom base, and if the bottom base is shorter than the length of two mutually perpendicular sides of a shapeable maximum right-angled isosceles triangle of the cross section of the electron beam, then a division algorithm for dividing the parallelogram vertically with a unit division length equal to the length of the bottom base of the parallelogram is used and graphical figure portions obtained by the division are written by the right-angled isosceles triangles or a combination of the right-angled isosceles triangles and the rectangle with four right-angled corners of the cross section of the beam.

Other objects and features of the invention will appear in the course of the description thereof, which follows.

BRIEF DESCRIPTION OF THE DRAWINGS

FIGS. 13P1 to 13P11 are trapezoidal shapes that are discussed with reference to FIG. 8.

DESCRIPTION OF THE PREFERRED EMBODIMENTS

Figure 2:
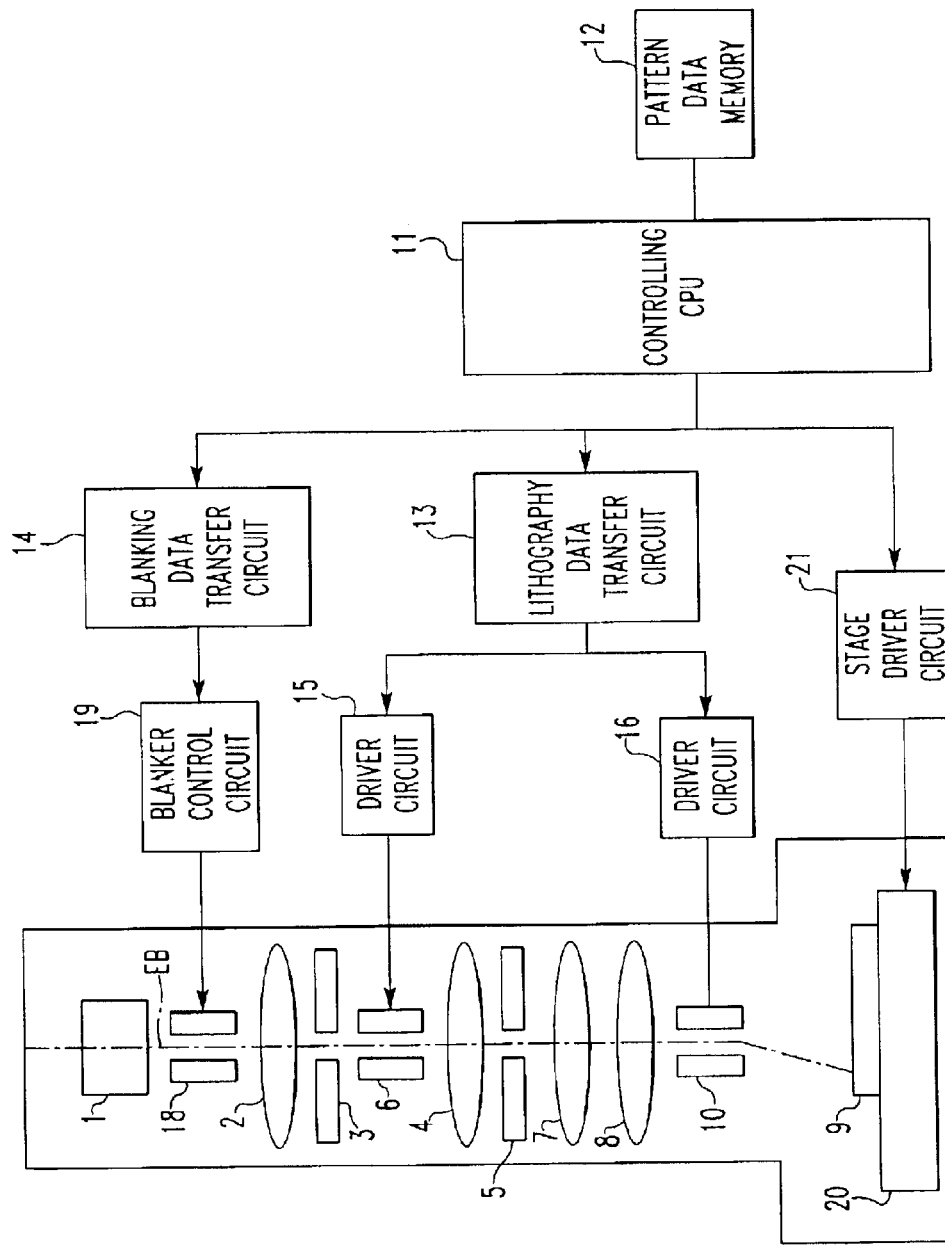
FIG. 2 is a block diagram showing the fundamental structure of a variable-area electron-beam lithography machine for implementing a lithographic method according to the present invention.

Embodiments of the present invention are hereinafter described in detail with reference to the accompanying drawings. FIG. 2 shows an example of the variable-area electron-beam lithography machine for implementing the method of the present invention. This machine includes an electron gun 1 for producing an electron beam EB that is directed onto a first shaping slit (baffle or aperture plate) 3 via an illumination lens 2.

An image of the aperture in the first shaping apertured baffle plate is focused onto a second shaping apertured baffle plate 5 by a shaping lens 4. The focal point can be varied by a shaping deflector 6. The electron beam passed through the second shaping slit (baffle or aperture plate) 5 is directed onto a material 9 to be written via a demagnification lens 7 and an objective lens 8. The position on the material 9 hit by the beam can be varied by a positioning deflector 10.

A CPU 11, used for controlling purposes, routes pattern data from a pattern data memory 12, such as a magnetic disk, to a lithography data transfer circuit 13 and to a blanking data transfer circuit 14.

The pattern data from the data transfer circuit 13 is supplied to driver circuits 15 and 16 for driving the shaping deflector 6 and the positioning deflector 10, respectively. Each of the driver circuits 15 and 16 consists of a D/A converter and an amplifier.

A blanking control signal from the blanking data transfer circuit 14 is supplied to a blanker control circuit 19 that controls a beam blanker (blanking electrode) 18 for blanking the electron beam emitted from the electron gun 1.

The controlling CPU 11 also controls a driver circuit 21 for a stage 20 on which the material 9 is carried, to move the material 9 as each field is written. The operation of the machine constructed in this way is described below.

The fundamental lithography operation is first described. Pattern data stored in the pattern data memory 12 are successively read out and supplied to the data transfer circuit 13. Based on the data from the data transfer circuit 13, the driver circuits 15 and 16 drive the shaping deflector 6 and the positioning deflector 10, respectively.

Based on the pattern data, the shaping deflector 6 shapes the cross section of the electron beam into unit forms. These unit forms of the cross section of the beam are successively directed at the material 9, so that the desired pattern is written. At this time, a blanking signal from the blanker control circuit 19 is sent to the blanker 18. As a result, the electron beam is blanked in synchronism with the beam irradiation of the material 9.

When a different field on the material 9 is written, an instruction is given to the stage driver circuit 21 from the CPU 11 to cause the stage 20 to move a given distance. The distance traveled by the stage 20 is constantly monitored by a laser distance measurement instrument (not shown). The position of the stage 20 is accurately controlled according to the results of the measurement from the measurement instrument.

The written pattern is a circuit pattern or interconnect pattern on an IC (integrated circuit). This circuit pattern is formed on a mask plate, for example, by combining various forms such as rectangular, square, triangular patterns, and trapezoidal forms.

As mentioned previously, in a lithography machine using an electron beam having only a rectangular cross section with four right-angled corners, a pattern having oblique lines such as a triangular pattern is approximately resolved into rectangles and then lithography is carried out. This method is simple but has the disadvantage that the writing speed decreases on pattern portions having oblique sides.

Recently, a novel electron-beam lithography machine making use of an electron beam having a non-rectangular cross section has been developed in order to perform lithography at a higher speed. Specifically, with respect to patterns having forms often encountered in LSI circuits, such as patterns having 45-degree oblique lines, an apertured baffle plate having apertures of various shapes is prepared and used as the second apertured baffle plate 5.

Where apertures of different shapes are formed in the second apertured baffle plate 5 and an aperture image (e.g., a square image) of the first apertured baffle plate is focused on a rectangular aperture with four right-angled corners (e.g., a square aperture), then it is impossible to position a second aperture in the portion that blocks the electron beam. It is necessary to form the second aperture at a location that is spaced from the square aperture by a distance equal to the dimension of the electron beam (e.g., having a square cross section) passed through the first apertured baffle plate 3. Where three or four apertures are formed, it is necessary that the positions of all the apertures meet this requirement.

Figure 3:
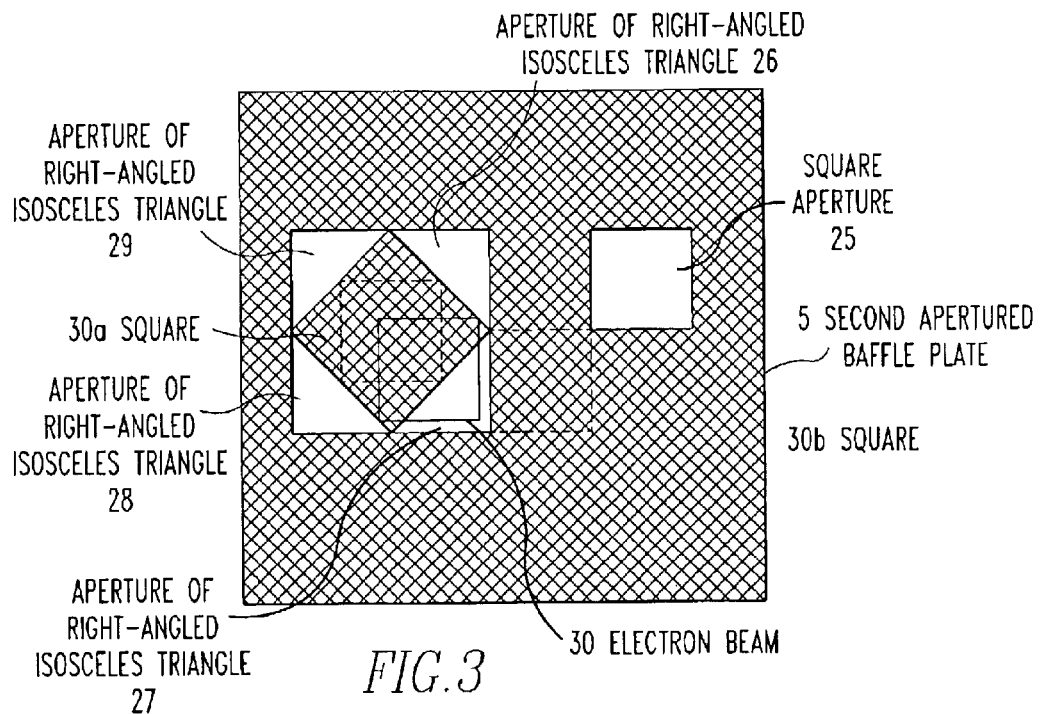
FIG. 3 is a diagram illustrating a second apertured baffle plate for shaping the cross section of an electron beam into a rectangle with four right-angled corners and right-angled isosceles triangles, the second apertured baffle plate being incorporated in the lithography machine shown in FIG. 2.

The second apertured baffle plate 5 capable of shaping the cross section of the electron beam into a rectangle with four right-angled corners and four right-angled isosceles triangles oriented in different directions can take a form as shown in FIG. 3, where a square aperture is indicated by numeral 25, while apertures of four right-angled isosceles triangles are indicated by 26–29, respectively. An electron beam 30 has a square cross section that is shaped by the first apertured baffle plate 3 and projected onto the second apertured baffle plate 5. The position on the second apertured baffle plate 5 hit by the beam can be varied by deflecting the beam by the shaping deflector 6.

Squares 30a and 30b indicated by broken lines are also shaped by the first apertured baffle plate 3 and indicate the cross section of the electron beam projected onto the second apertured baffle plate 5. The distance between the adjacent ends of the fundamental square aperture 25 and the aperture 26 formed by the right-angled isosceles triangles is equal to the dimension of the cross section of the electron beam passed through the first apertured baffle plate 3. Furthermore, the center-to-center distance between the adjacent bottoms of the four apertures 26–29 of right-angled isosceles triangles is equal to the dimension of the cross section of the electron beam passed through the first apertured baffle plate 3.

Figure 4:
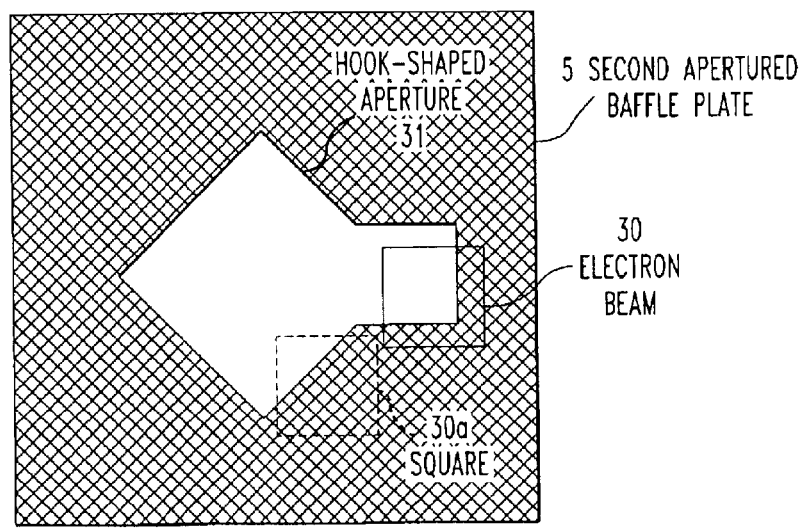
FIG. 4 is a diagram illustrating another second apertured baffle plate for shaping the cross section of the electron beam into a rectangle with four right-angled corners and right-angled isosceles triangles.

FIG. 4 shows another example of the second apertured baffle plate 5. In this example, a single hook-shaped aperture 31 is formed. The electron beam 30 is shaped by the first apertured baffle plate 3 and projected onto the second apertured baffle plate 5. The position on the second apertured baffle plate 5 hit by the beam can be changed by deflecting the beam by the shaping deflector 6. A square 30a indicated by a broken line shows an electron beam that is also shaped by the first apertured baffle plate 3 and projected onto the second apertured baffle plate 5. The cross section of the electron beam can also be shaped into an arbitrary shape such as square, rectangle, or right-angled isosceles triangles, using the second apertured baffle plate shown in FIG. 4.

Figure 5:
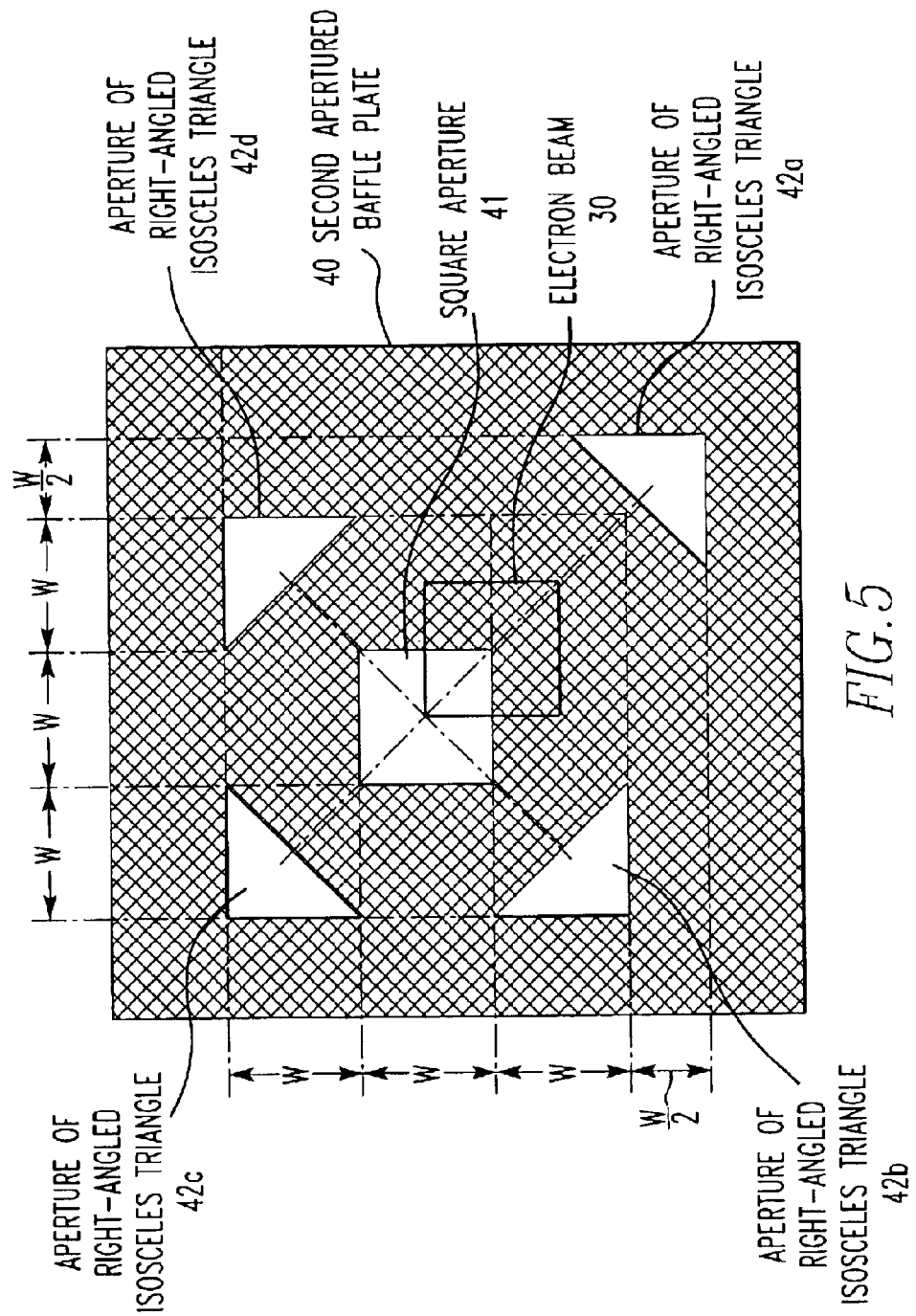
FIG. 5 is a diagram illustrating a further second apertured baffle plate for shaping the cross section of the electron beam into a rectangle with four right-angled corners and right-angled isosceles triangles.

FIG. 5 shows a further example of the second apertured baffle plate 5. This second apertured baffle plate, indicated by numeral 40, is provided with a square aperture 41 having a maximum beam size around its center.

Apertures 42a, 42b, 42c, and 42d of right-angled isosceles triangles, each having a 45-degree hypotenuse, are placed around this square aperture 41. The longer sides of these four apertures 42a–42d of right-angled isosceles triangles face toward the vertices of the square aperture 41.

One aperture 42a of the four apertures of the right-angled isosceles triangles is so located that the distance between the vertex of the square aperture 41 closest to the aperture 42a and the midpoint of its hypotenuse is about 1.4 times the maximum beam size W ($=\sqrt{2} \cdot W$). In other words, the distance from the vertex of the square aperture 41 to the midpoint of the hypotenuse of the triangular aperture 42a is set to at least the length of the diagonals of the square aperture 41.

The remaining three apertures 42b–42d, each taking the form of a right-angled isosceles triangle, are so positioned that the distance between the midpoint of its hypotenuse and the closest vertex of the square aperture 41 is about 0.7 times W ($=\sqrt{2} \cdot W/2$) the maximum beam size W. In other words, the distance from any vertex of the square aperture 41 to the midpoint of the hypotenuse of the closest triangular aperture 42b, 42c, or 42d is set to at least half of the length of the diagonals of the square aperture 41.

The lithographic method according to the present invention is carried out using a lithography system capable of shaping the cross section of the produced electron beam into a rectangle with four right-angled corners and right-angled isosceles triangles as described previously.

In the algorithm according to the present invention, a graphical figure having two legs (oblique sides) whose corners have angles other than 45 degrees is split into stripes as in the conventional technique. However, with respect to a graphical figure having at least one leg with a 45-degree angle, a portion including the 45-degree leg is always extracted. In other words, an area adjacent a 45-degree leg is separately considered for being written with beams having a shape of a right-angled isosceles triangle. This permits the graphical figure to be written while efficiently using the beam of a cross section having right-angled isosceles triangles.

An algorithm for writing a graphical figure using the lithography system capable of shaping the cross section of the electron beam into the square with four right-angled corners and right-angled isosceles triangles as described above is next described.

Figure 6A:
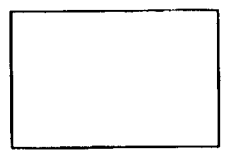
FIGS. 6A, 6B, 6C, 6B', and 6C' are views showing various kinds of trapezoidal patterns.
Figure 6B:
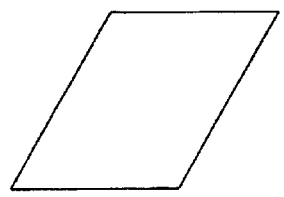
Figure 6C:
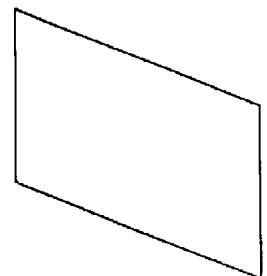
Figure 6B:
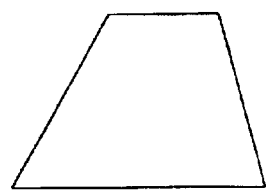
Figure 6C:
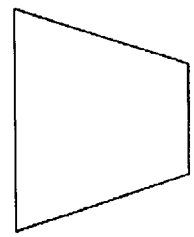

First, input pattern data read into the CPU 11 from the pattern data memory 12 is classified as one of fundamental shapes shown in FIGS. 6A, 6B, 6C, 6B' or 6C', i.e., a square (FIG. 6A), an X trapezoid (FIG. 6B or 6B'), and a Y trapezoid (FIG. 6C or 6C'). Note that a trapezoid having two parallel sides extending in the X-direction is herein referred to as an "X trapezoid" and that a trapezoid having two parallel sides extending in the Y-direction, i.e., is herein referred to as a "Y trapezoid".

Figure 7:
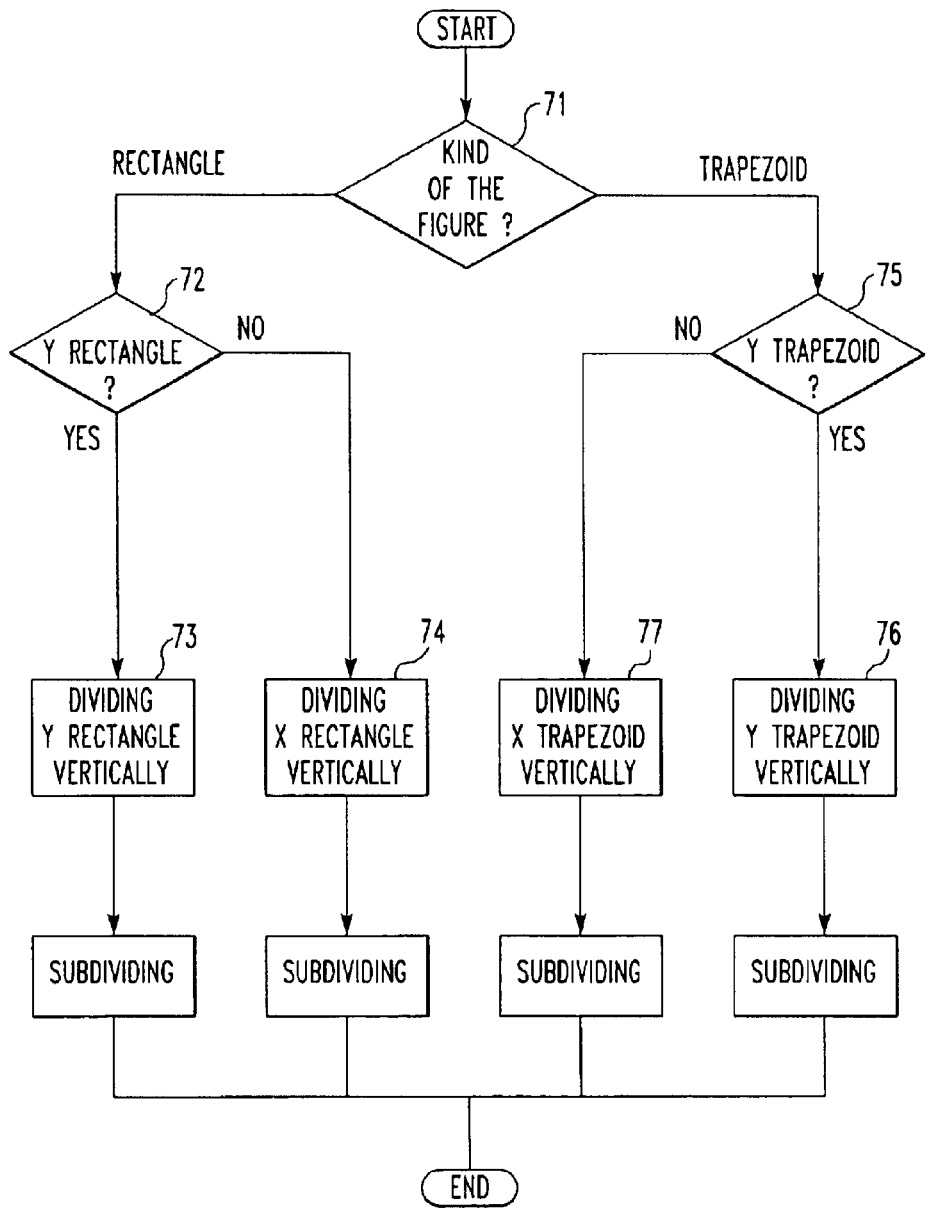
FIG. 7 is a flowchart illustrating the fundamental sequence of dividing a graphical pattern in accordance with the present invention.

FIG. 7 shows a flowchart illustrating fundamental processing for dividing a graphical figure. A decision is made to judge the kind of the figure, i.e., as to whether the input data about the graphical figure is data about either a rectangle with four right-angled corners or a trapezoid at 71 (step 1).

If the result of the decision made in step 1 is that the figure is a rectangle, a decision is made at 72 as to whether it is a Y rectangle (that is herein defined as a rectangle whose longer one of two parallel sides extends in the Y-direction) (step 2). If the result of the decision is YES, processing for dividing the Y rectangle vertically (that is, in a direction perpendicular to the base) is performed at 73. If the result is NO, processing for dividing an X rectangle (that is herein defined as a rectangle whose longer one of two parallel sides extends in the X-direction) is performed at 74.

If the result of the decision made in 71 (step 1) is that the figure is a trapezoid, a decision is made at 75 as to whether the trapezoid is a Y trapezoid (step 3). If the result is YES, processing for dividing the Y trapezoid vertically is performed at 76. If the result is NO, processing for dividing an X trapezoid vertically is performed at 77. In this processing for vertical division, the figure is essentially divided with the maximum cross-sectional size of the beam. Portions of the figure obtained by vertically dividing it are subdivided.

Figure 9:
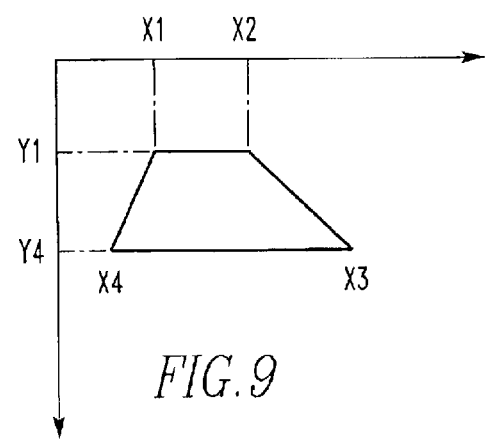
FIG. 9 is a diagram illustrating input data.
Figure 8:
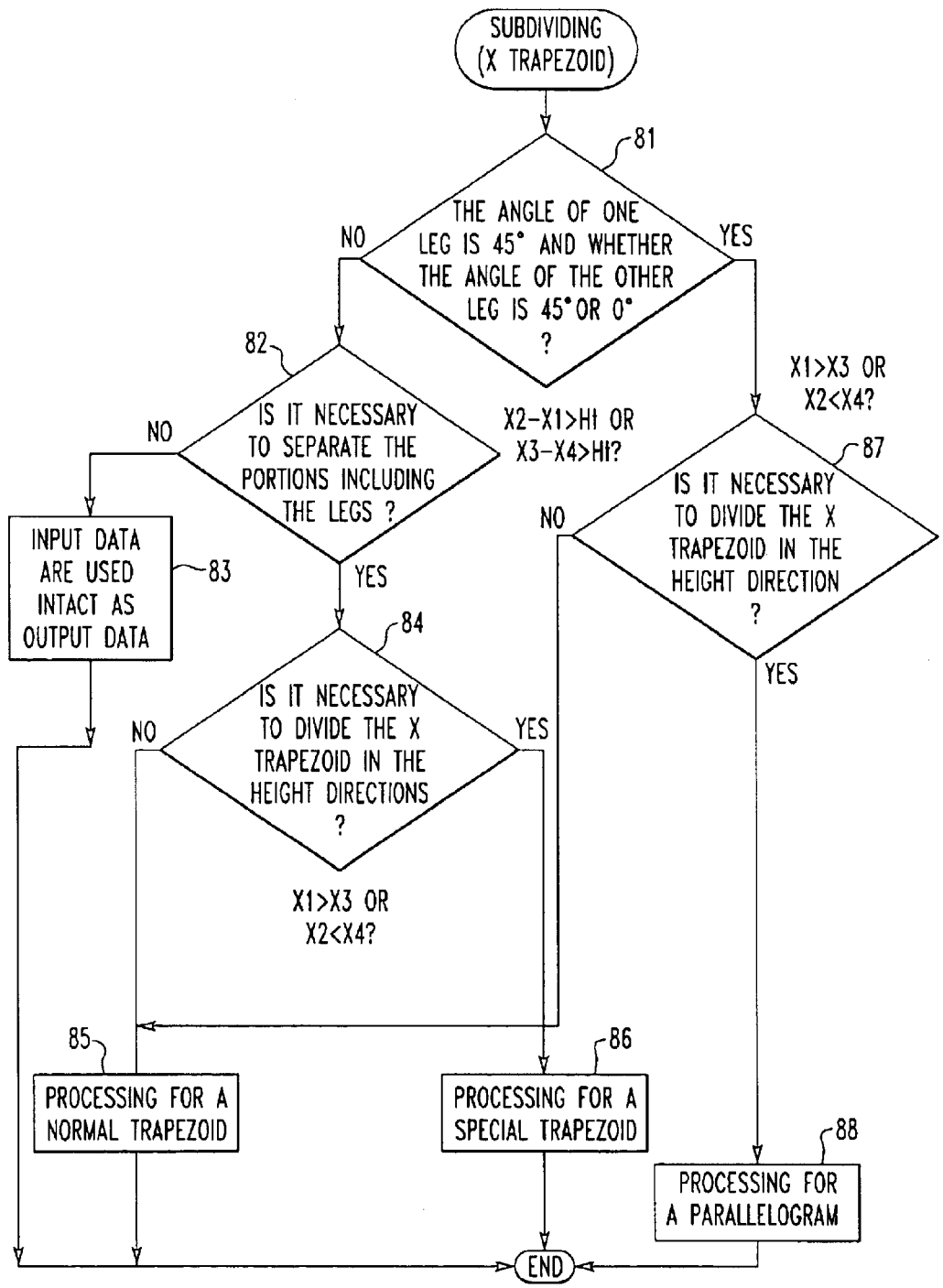
FIG. 8 is a flowchart schematically illustrating an algorithm for subdividing an X trapezoid.

FIG. 8 is a flowchart schematically illustrating the subdivision algorithm used where the various graphical figures vertically subdivided as illustrated in FIG. 7 are input to the CPU 11. This flowchart illustrates an example in which an X trapezoid is divided. Input data is represented by combinations X1, Y1, X2, X3, X4, and Y4 as shown in FIG. 9.

When data about such an X trapezoid is input, a decision is made at 81 as to whether the angle of one leg (angle between this leg and the normal) is 45 degrees and whether the angle of the other leg is 45 or 0 degrees (step 1).

Figures 1A, 1B, 1C:
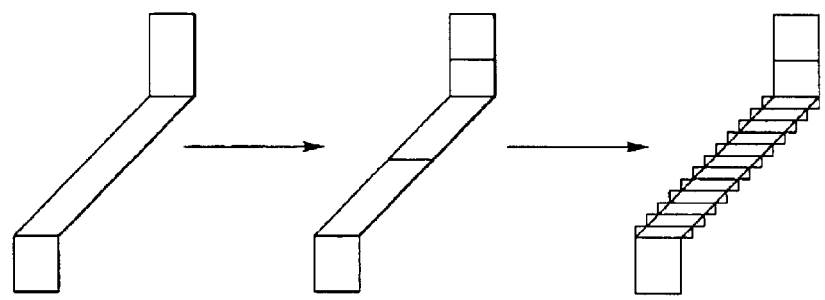
FIGS. 1A, 1B, 1C, 1A', 1D, and 1E are views illustrating a conventional method of writing a pattern including oblique lines.
Figures 1A, 1D, 1E:
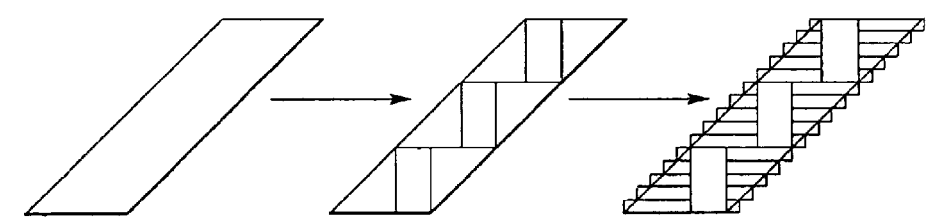

If the result of this decision is NO, a decision is made at 82 as to whether it is necessary to separate the portions including the legs of the X trapezoid (step 2). That is, a decision is made as to whether the dimension of the top or bottom base of the X trapezoid is greater than the maximum size Ht of the cross section of the beam as given by X2−X1>Ht or X3−X4>Ht Where these conditions are not satisfied (e.g., graphical FIGS. 13P1 and 13P2), the input data are used intact as output data while taking the trapezoid as one including legs having arbitrary angles at 83. The figure is split into rectangular stripes. In this case, any trapezoid having at least one leg making an angle in excess of 45 degrees does not practically exist. Hence, there is no need to extract portion with leg.

On the other hand, where the result of the decision at 82 is YES, i.e., the relations described above are satisfied, a decision is made at 84 as to whether it is necessary to divide the X trapezoid in the height direction (step 3). That is, a decision is made as to whether the following conditions are met:

X1>X3 or X2<X4

Where the result of this decision is NO (e.g., FIG. 13P3 or 13P4), processing for a normal trapezoid is carried out. Where the result is YES, processing for a special trapezoid is performed at 86.

In the processing for a normal trapezoid at 85, the portions including the legs are separated. If the angles of the legs are 45 degrees, lithography is performed by the right-angled isosceles triangle of the cross section of the beam. If the angles are different from 45 degrees, the portions including the legs are split into rectangular stripes and then lithography is performed. The square or rectangular portions from which the portions including the legs have been separated are written by the rectangle cross section beam.

Where the result of the decision made at 84 (step 3) is YES (e.g., FIG. 13P5 or 13P6), the processing for a special trapezoid is performed at 86. This processing consists of dividing the X trapezoid into two in the height direction and then making a decision similar to the decision made in step 2 regarding each of the two figures obtained by the division. One or more divisions will convert the special trapezoid into multiple normal trapezoids.

If the result of the decision made at 81 (step 1) is YES (i.e., the angle of one leg is 45 degrees and the angle of the other leg is 45 or 0 degrees), a decision is made at 87 under the same conditions as in step 3 as to whether a division in the height direction is necessary.

Where the result of the decision at 87 is NO (e.g., FIGS. 13P7, 13P8, or 13P9), the processing for a normal trapezoid is performed at 85. Where the result is YES, processing for a special trapezoid including a leg having an angle of 45 degrees is performed in the manner described below.

The graphical figure which has undergone the processing at 88 for a special trapezoid including a leg having an angle of 45 degrees is a parallelogram in practice (e.g., a figure such as 13P10 or 13P11). Practically, there is no possibility that the dimension of the bottom base of the figure which has undergone this processing is greater than the maximum size Ht of the cross section of the beam.

Figure 10:
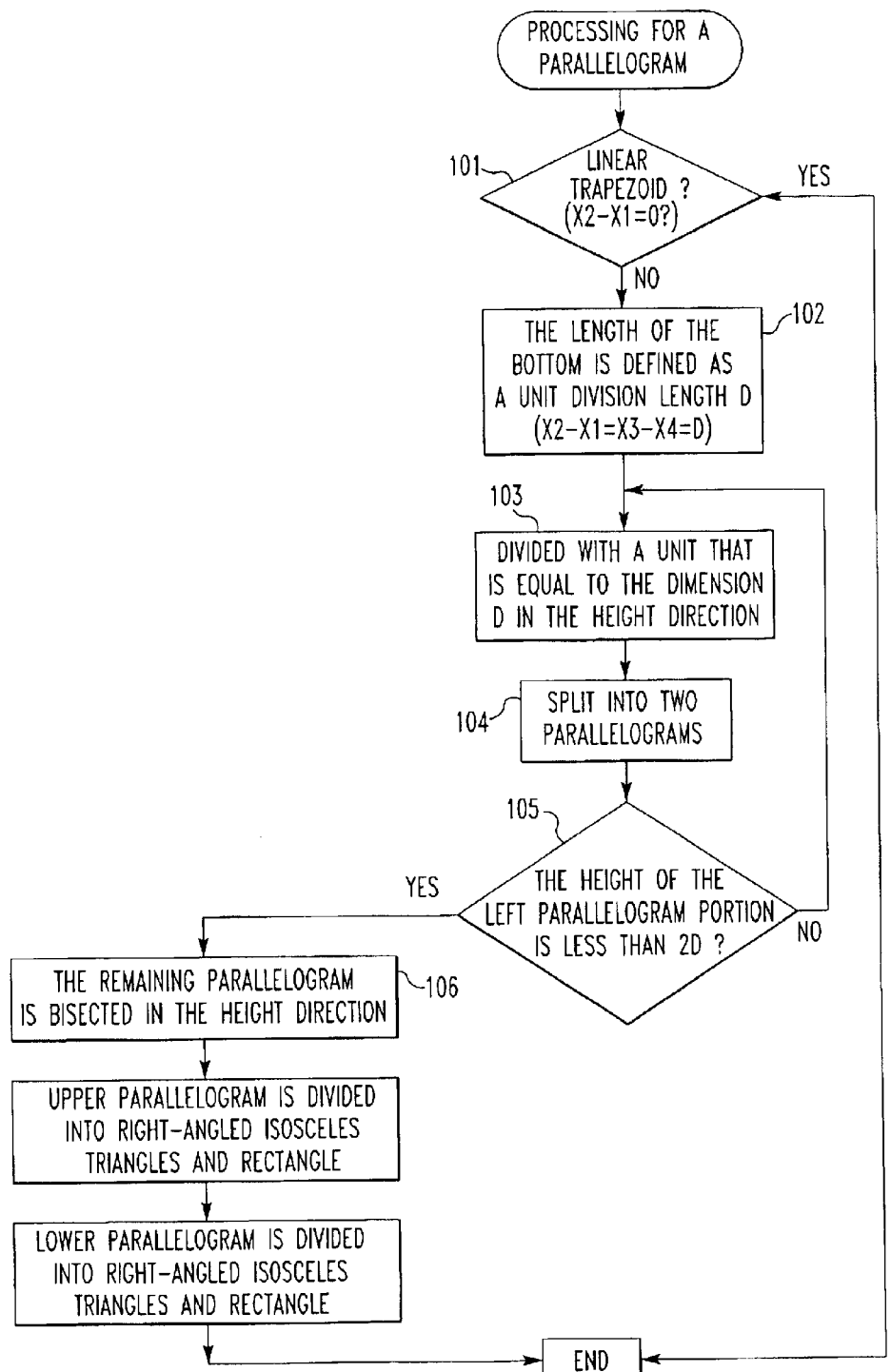
FIG. 10 is a flowchart particularly illustrating special processing performed where there are 45-degree oblique lines.
Figure 11:
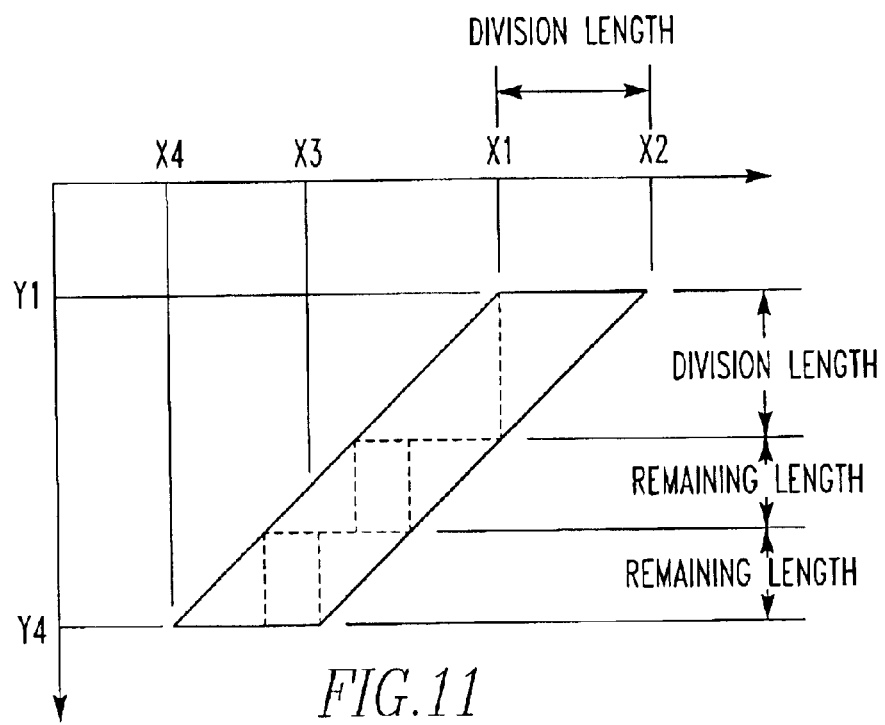
FIG. 11 is a diagram showing input graphical data useful to understand FIG. 10.

FIG. 10 is a flowchart particularly illustrating the processing for a special trapezoid including a leg having an angle of 45 degrees. The graphical figure about which data is input is represented by combinations of six data items: X1, Y1, X2, X3, X4, and Y4 as shown in FIG. 11.

First, a decision is made at 101 as to whether the graphical figure about which data is input is an X or Y trapezoid having top and bottom bases having lengths of 0 (herein referred to as a linear trapezoid), based on whether the value of X2−X1 is zero or not (step 1). If the result is YES, it is a linear trapezoid, and the figure is not divided. Also, lithography is not performed.

If the result is NO, the figure is divided at 102. In this case, the length of the bottom base of the parallelogram is defined as a unit division length D (i.e., X2−X1=X3−X4= D). The parallelogram is divided with a unit that is equal to the dimension D in the height direction at 103. With respect to each of the parallelograms obtained by the division, it is split into two parallelograms at 104.

Since the parallelogram having a height of D is extracted, a parallelogram portion is left. A decision at 105 is made as to whether the height of the left parallelogram portion is less than 2D or not (step 2).

If the result of the decision is NO, the figure is again divided with D in the height direction at 103. A parallelogram having a height of D is extracted.

If the result is YES, the remaining parallelogram is bisected in the height direction at 106.

This bisection results in upper and lower parallelograms. With respect to each of these two parallelograms, a portion around the leg, i.e., a right-angled isosceles triangle, is extracted. That is, the figure is divided into right-angled isosceles triangles on both sides and an intervening rectangular portion. As a result of the processing described thus far, the processing for dividing the X trapezoid ends.

Data about the right-angled triangles and rectangle obtained by the division is sent from the CPU 11 to the data transfer circuit 13. The driver circuit 15 for driving the shaping deflector 6 operates in such a way as to shape the cross section of the beam into the right-angled isosceles triangles and rectangle having desired magnitude and orientation. The positioning deflector driver circuit 16 operates such that the electron beam of the shaped cross section is directed at a desired position on the material.

Where the height of the remaining parallelogram is equal to 2D, it is bisected in the height direction, resulting in upper and lower parallelograms. Only right-angled isosceles triangles are extracted from each of these upper and lower parallelograms.

Figure 12:
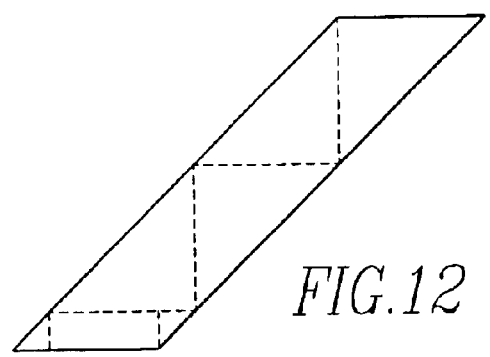
FIG. 12 is a view showing another division method in the special processing performed where there are 45-degree oblique lines.

In the figure division illustrated in the flowchart of FIG. 10, a parallelogram is divided with the unit division length D in the height direction. If the height of the remaining parallelogram is shorter than 2D, the remaining parallelogram is bisected in the height direction as illustrated in FIG. 11. Alternatively, the processing for dividing a parallelogram with the unit division length D in the height direction may be repeated until the height of the remaining parallelogram decreases below D as illustrated in FIG. 12. In this case, the number of division steps may be fewer. However, if the height of the finally remaining parallelogram is quite small, the lithographic accuracy on this portion may deteriorate.

In the processing illustrated in the flowchart of FIG. 8, when data about an X trapezoid is entered, a decision is made as to whether the angle of one leg (angle made between this leg and the normal) is 45 degrees and whether the angle of the other leg is 45 or 0 degrees in the first step. This first step may consist of making a decision as to whether the angle of the two legs is 45 degrees. If so, the result of the decision made regarding a graphical figure in which the angle of one leg is 45 degrees and the angle of the other leg is 0 degrees (such as FIG. 13P7 or FIG. 13P9) will be NO. Then steps 2 and 3 are carried out. The processing for a normal trapezoid is performed.

In the processing illustrated in the flowchart of FIG. 8, when data about an X trapezoid is entered, a decision is made as to whether the angle of one leg (angle made between this leg and the normal) is 45 degrees and the angle of the other leg is 45 or 0 degrees in the first step. This first step may consist of making a decision as to whether the angle of any one leg is 45 degrees. If so, the result of the decision made in the first step regarding a graphical figure in which the angle of one leg is 45 degrees and the angle of the other leg is neither 45 degrees nor 0 degrees (such as FIG. 13P3) will be YES. Then step 2 is carried out. The processing for a normal trapezoid is performed.

As described thus far, the lithographic method using a variable-area electron-beam lithography machine according to the present invention starts with passing an electron beam through a first apertured baffle plate having an aperture with four right-angled corners. The passed beam is then directed at a second apertured baffle plate. The beam is then directed at a material to be written. The lithography system can shape the cross section of the beam passed through the aperture in the second apertured baffle plate into a rectangle with four right-angled corners and right-angled isosceles triangles. This lithographic method is characterized in that where a graphical figure having at least one leg (oblique side) that makes an angle of 45 degrees with respect to the normal to the bottom base is to be written on the material, a portion including the leg is always extracted. Therefore, lithography is performed efficiently by making efficient use of the right-angled isosceles triangles of the cross section of the beam.

Especially where this lithographic method is used for a parallelogram in which each leg makes an angle of 45 degrees with respect to the normal to the bottom base and which has a bottom base shorter than the length of the two perpendicular sides of a shapeable maximum right-angled isosceles triangle of the cross-sectional shape of the electron beam, the parallelogram is divided in the vertical direction with a unit division length equal to the length of the bottom base of the parallelogram, and the obtained figure parts are written with the right-angled isosceles triangles of the cross section of the beam or a combination of these right-angled isosceles triangles and the rectangle with four right-angled corners. Therefore, portions including both legs of a parallelogram extracted by a division can be written by shooting the right-angled isosceles triangles of the cross section of the beam.

The present invention makes it possible to write graphical figures having 45-degree oblique lines quite frequently encountered in LSI patterns with a decreased number of electron beam shots such that the legs (oblique sides) of oblique graphical figures can be written quite accurately.

Having thus described my invention with the detail and particularity required by the Patent Laws, what is desired protected by Letters Patent is set forth in the following claims.

The invention claimed is:

1. A lithographic method using a variable-area electron-beam lithography machine having first and second baffle plates, each of said first and second baffle plates having an aperture, said lithographic method comprising the steps of:

passing an electron beam through said first baffle plate having the aperture with four right-angled corners;

directing the electron beam emerging from the aperture in said first baffle plate at said second baffle plate; and directing the electron beam emerging from the aperture in said second baffle plate at a material to be written, wherein said electron-beam lithography machine is capable of shaping a cross section of the electron beam emerging from the aperture in the second baffle plate into a rectangle with four right-angled corners and right-angled isosceles triangles, wherein when a trapezoidal graphical figure having a top base, a bottom base, and two legs is to be written on said material, a sequence of operations is performed, and wherein said sequence of operations consists of performing a first step consisting of making a decision as to whether the angle made between one of the legs and the normal to the bottom base is 45 degrees and whether the angle made between the other leg and the normal to the bottom base is 45 or 0 degrees, performing a second step consisting of making a decision as to whether it is necessary to divide the trapezoidal graphical figure in the height direction if the result of the decision made in the first step is YES, performing a third step consisting of dividing the trapezoidal graphical figure in the height direction using a unit division length equal to the length of the bottom base of the trapezoidal graphical figure, separating portions including legs from resulting figure parts, and writing the separated portions including the legs by the right-angled isosceles triangles of the cross section of the beam if the result of the decision made in the second step is YES, performing a fourth step consisting of separating the portions including the legs of the trapezoidal graphical figure and writing the separated portions including the legs by the right-angled isosceles triangles of the cross section of the beam if the result of the decision made in the second step is NO, performing a fifth step consisting of making a decision as to whether it is necessary to separate the portions including the legs if the result of the decision made in the first step is NO, and performing a sixth step consisting of separating the portions including the legs if the result of the decision made in the fifth step is YES, and writing the portions including the legs by the right-angled isosceles triangles of the cross section of the beam if the angle made between the leg of each separated portion and the bottom base is 45 degrees.

2. A lithographic method using a variable-area electron-beam lithography machine having first and second baffle plates, each of said first and second baffle plates having an aperture, said lithographic method comprising the steps of:

passing an electron beam through said first baffle plate having the aperture with four right-angled corners;

directing the electron beam emerging from the aperture in said first baffle plate at said second baffle plate; and directing the electron beam emerging from the aperture in said second baffle plate at a material to be written, wherein said electron-beam lithography machine is capable of shaping a cross section of the electron beam emerging from the aperture in the second baffle plate into a rectangle with four right-angled corners and right-angled isosceles triangles, wherein when a trapezoidal graphical figure having a top base, a bottom base, and two legs is to be written on said material, a sequence of operations is performed, and wherein said sequence of operations consists of performing a first step consisting of making a decision as to whether the angle made between one leg of said trapezoidal graphical figure and the normal to the bottom base is 45 degrees and whether the angle made between the other leg and the normal to the bottom base is 45 degrees, performing a second step consisting of making a decision as to whether it is necessary to divide the trapezoidal graphical figure in the height direction if the result of the decision made in the first step is YES, performing a third step consisting of dividing the trapezoidal graphical figure in the height direction using a unit division length equal to the length of the bottom base of the trapezoidal graphical figure, separating portions including the legs from resulting figure parts, and writing the separated portions including the legs by the right-angled isosceles triangles of the cross section of the electron beam if the result of the decision made in the second step is YES, performing a fourth step consisting of separating the portions including the legs of the trapezoidal graphical figure and writing the separated portions including the legs by the right-angled isosceles triangles of the cross section of the beam if the result of the decision made in the second step is NO, performing a fifth step consisting of making a decision as to whether it is necessary to separate the portions including the legs if the result of the decision made in the first step is NO, and performing a sixth step consisting of separating the portions including the legs if the result of the decision made in the fifth step is YES, and writing the portions including the legs by the right-angled isosceles triangles of the cross section of the beam if the angle made between the leg of each separated portion and the bottom base is 45 degrees.

3. A lithographic method using a variable-area electron-beam lithography machine having first and second baffle plates, each of said first and second baffle plates having an aperture, said lithographic method comprising the steps of:

passing an electron beam through said first baffle plate having the aperture with four right-angled corners;

directing the electron beam emerging from the aperture in said first baffle plate at said second baffle plate; and directing the electron beam emerging from the aperture in said second baffle plate at a material to be written, wherein said electron-beam lithography machine is capable of shaping a cross section of the electron beam emerging from the aperture in the second baffle plate into a rectangle with four right-angled corners and right-angled isosceles triangles, wherein when a trapezoidal graphical figure having a top base, a bottom base, and two legs is to be written on said material, a sequence of operations is performed, and wherein said sequence of operations consists of performing a first step consisting of making a decision as to whether the angle made between any one leg of the trapezoidal graphical figure and the normal to the bottom base is 45 degrees, performing a second step consisting of making a decision as to whether it is necessary to divide the trapezoidal graphical figure in the height direction if the result of the decision made in the first step is YES, performing a third step consisting of dividing the trapezoidal graphical figure in the height direction with a unit division length equal to the length of the bottom base of the trapezoidal graphical figure, separating portions including the legs from resulting figure parts, and writing the separated portions including the legs by the right-angled isosceles triangles of the cross section of the beam if the result of the decision made in the second step is YES, performing a fourth step consisting of separating the portions including the legs of the trapezoidal graphical figure and writing the separated portions including the legs by the right-angled isosceles triangles of the cross section of the beam if the result of the decision made in the second step is NO, performing a fifth step consisting of making a decision as to whether it is necessary to separate the portions including the legs if the result of the decision made in the first step is NO, and performing a sixth step consisting of separating the portions including the legs if the result of the decision made in the fifth step is YES, and writing the portions including the legs by the right-angled isosceles triangles of the cross section of the beam if the angle made between the leg of each separated portion and the bottom base is 45 degrees.

4. A lithographic method using a variable-area electron-beam lithography machine as set forth in any one of claims 1 to 3, wherein (A) if the result of the decision made in the fifth step is YES, a decision is made as to whether it is necessary to divide the trapezoidal graphical figure in the height direction, (B) if the result of this decision is NO, portions including the legs are separated and written by the right-angled isosceles triangles of the cross section of the beam provided that the angle made between each separated leg and the bottom base is 45 degrees, and (C) if the result of this decision is YES, the sequence returns to the fifth step.

5. A lithographic method using a variable-area electron-beam lithography machine having first and second baffle plates, each of said first and second baffle plates having an aperture, said lithographic method comprising the steps of:

passing an electron beam through said first baffle plate having the aperture with four right-angled corners;

directing the electron beam emerging from the aperture in said first baffle plate at said second baffle plate; and directing the electron beam emerging from the aperture in said second baffle plate at a material to be written, wherein said electron-beam lithography machine is capable of shaping a cross section of the electron beam emerging from the aperture in the second baffle plate into a rectangle with four right-angled corners and right-angled isosceles triangles, and wherein where a written graphical figure is a parallelogram having a top base, a bottom base, and two legs, each of said two legs making an angle of 45 degrees with respect to the normal to the bottom base, said bottom base being shorter than two mutually perpendicular sides of a right-angled isosceles triangle of a shapeable maximum cross-sectional shape of the electron beam, a division algorithm for dividing the parallelogram vertically with a unit division length equal to the length of the bottom base of the parallelogram is used and graphical figure portions obtained by the division are written by the beam of the electron beam having a cross-sectional shape consisting of either right-angled isosceles triangles or a combination of the right-angled isosceles triangles and a rectangle with four right-angled corners.

6. A lithographic method using a variable-area electron-beam lithography machine as set forth in any one of claims 1, 2, 3, or 5 wherein the trapezoidal graphical figure is divided in the height direction using a unit division length equal to the length of the bottom base of the trapezoidal graphical figure, and wherein if the remaining height decreases below twice the unit division length, the remaining graphical figure is bisected in the height direction.

* * * * *

UNITED STATES PATENT AND TRADEMARK OFFICE
CERTIFICATE OF CORRECTION

PATENT NO. : 6,753,540 B2
DATED : June 22, 2004
INVENTOR(S) : Osamu Wakimoto

It is certified that error appears in the above-identified patent and that said Letters Patent is hereby corrected as shown below:

<u>Title page,</u>
Item [30], Foreign Application Priority Data, the following should be entered:
-- [30]   Foreign Application Priority Data
        Oct. 26, 2001   (JP) ........................... 2001-328775 --.

Signed and Sealed this

Fifth Day of April, 2005

JON W. DUDAS
*Director of the United States Patent and Trademark Office*